United States Patent
Essaian et al.

[11] Patent Number: 6,060,392
[45] Date of Patent: May 9, 2000

[54] FABRICATION OF SILICIDES BY EXCIMER LASER ANNEALING OF AMORPHOUS SILICON

[75] Inventors: Stepan Essaian, San Jose, Calif.; Abdalla Naem, Overisje, Belgium

[73] Assignee: National Semiconductor Corporation, Santa Clara, Calif.

[21] Appl. No.: 09/022,070

[22] Filed: Feb. 11, 1998

[51] Int. Cl.[7] .................................................. H01L 21/44
[52] U.S. Cl. ...................... 438/682; 438/166; 438/308; 438/581; 438/649; 438/662
[58] Field of Search .................... 438/166, 308, 438/682, 683, 581, 583, 592, 651, 649, 664

[56] References Cited

U.S. PATENT DOCUMENTS

| | | | |
|---|---|---|---|
| 5,488,000 | 1/1996 | Zhang et al. | 438/166 |
| 5,766,989 | 6/1998 | Maegawa et al. | 438/166 |
| 5,804,499 | 9/1998 | Dehm et al. | 438/592 |
| 5,879,977 | 3/1999 | Zhang et al. | 438/149 |
| 5,897,347 | 4/1999 | Yamazaki et al. | 438/166 |
| 5,904,770 | 5/1999 | Ohtani et al. | 438/485 |
| 5,923,968 | 7/1999 | Yamazaki et al. | 438/166 |

OTHER PUBLICATIONS

Sigmon, "Silicide Formation Using Laser and Electron Beams," *Laser and Electron–Beam Solid Interactions and Materials Processing*, pp. 511–523 (1981).

Chen, et al., "Polysilicon TFT Technology Will Solve Problems of Mobility, Pixel Size, Cost, and Yield," *Solid State Technology*, pp. 113–120 (1996).

Maa, et al., "Reaction of Amorphous Silicon With Cobalt and Nickel Silicides Before Disilicide Formation," *Mat. Res. Symp. Proc.* 402, pp. 185–190 (1996).

Osburn, et al., "Metal Silicodes: Active Elements of ULSI Contacts," *J. Electron. Mater.* 25 (11), pp. 1725–1739 (1996).

Zhang, et al., "KrF Excimer Laser Annealed TFT with Very High Field–Effect Mobility of 329 $cm^2/V \cdot s$," *IEEE Electron Device Lett.* 13 (5), pp. 297–299 (1992).

*Primary Examiner*—Carl Whitehead, Jr.
*Assistant Examiner*—Khanh Duong
*Attorney, Agent, or Firm*—Limbach & Limbach L.L.P.

[57] ABSTRACT

Stable suicides are formed utilizing excimer laser crystallization in place of a conventional second high temperature rapid thermal processing annealing step. Specifically, thermally unstable silicide having a metal-rich surface layer is conventionally formed utilizing deposition of refractory metal followed by low temperature annealing. After removal of unreacted refractory metal, an amorphous silicon film is deposited on top of the unstable silicide and exposed to radiation from an excimer laser, such that the amorphous silicon melts, reacts with refractory metal from the underlying unstable silicide, and reforms as thermally stable silicide evidencing low electrical resistance.

8 Claims, 4 Drawing Sheets

FABRICATION OF SILICIDES BY EXCIMER LASER ANNEALING OF AMORPHOUS SILICON

BACKGROUND OF THE INVENTION

1. Field of the Invention

The present invention relates to a process for forming stable silicides, and more specifically, to a process of excimer laser crystallization of amorphous silicon deposited on top of a layer of unstable silicide to form thermally stable silicide having low electrical resistance.

2. Description of the Related Art

With the decreased size of semiconductor devices, the sheet resistivity of the electrically-conducting structures, such as the gates of MOS transistors, emitters of bipolar transistors, local interconnect regions of MOS and bipolar transistors, and interconnect lines connecting devices together, is beginning to limit the speed of operation.

One well-known technique for reducing sheet resistivity is to form a layer of metal silicide over the electrically conducting structures. $TiSi_2$ and $CoSi_2$ are the most extensively utilized metal silicides, although other refractory metals such as platinum, palladium, and nickel may also form silicides. Silicided structures provide the lower resistivity of a metal silicide, together with the well-known attributes of silicon.

FIGS. 1A–1E show the conventional formation of a layer of thermally-stable silicide. FIG. 1A shows silicon 2, adjacent to non-silicon 3. Silicon 2 is typically of single crystal form, but may also be polycrystalline. Non-silicon 3 may be oxide, metal, or some other non-silicon feature typically present in modern semiconductor devices.

FIG. 1B shows the deposition of metal layer 4 on top of silicon 2 and non-silicon 3. Metal layer 4 may be composed of a variety of refractory metals, with cobalt or titanium being preferred.

FIG. 1C shows the first conventional low temperature annealing step to form thermally unstable silicide 6 having metal-rich surface region 6a, on top of silicon 2. Non-silicon 3 does not react with metal 4 to form unstable silicide 6 due to an absence of silicon to serve as a template for silicide formation.

During this first, low-temperature annealing step, suicides generally form on top of silicon 2 in a variety of thermally unstable phases that display relatively high sheet resistance. The first annealing step for $CoSi_2$ takes place at a temperature of about 500° C. For $TiSi_2$, at temperatures below approximately 650° C. a C-49 phase is initially formed which has a relatively small grain size ($\approx 1$ $\mu$m) and high sheet resistance.

FIG. 1D shows removal of unreacted metal layer 4 using conventional wet etching techniques. FIG. 1E shows the conventional second annealing step, wherein the silicon 2 and unstable silicide 6 are subjected to substantially higher temperatures than in the first annealing step. During this second annealing step, thermally unstable silicide phase 6 having metal-rich surface layer 6a is transformed into a thermally stable polycrystalline silicide phase possessing lower sheet resistance. For example during the formation of $TiSi_2$, the second annealing step promotes formation of the C-54 phase $TiSi_2$, which has a larger grain size (<1 $\mu$m) and much lower sheet resistance than the C-49 phase.

In order to form the thermally stable C-49 phase of $TiSi_2$, the second anneal must take place at a temperature of about 850° C. To form thermally stable $CoSi_2$, the second annealing temperature must take place at about 650° C.

There are several major problems associated with forming silicides utilizing the conventional two-step annealing method described above. First, the high temperatures necessary for the second rapid thermal processing annealing step shown in FIG. 1D create device reliability problems. Specifically, heating the entire silicon region to temperatures above 650° C. can cause unwanted diffusion of conductivity-altering dopant already precisely introduced into the silicon. Moreover, high temperatures during the second annealing step can cause unwanted lateral outgrowth of silicon oxide structures that have already been formed, for example narrow spacers protecting the edges of gate structures present on MOS transistor devices.

Therefore, it is desirable to utilize a process of forming silicides that does not require subjecting all of the silicon at once to the high temperatures associated with a conventional second annealing step.

A second problem associated with forming silicides in the conventional manner is that disorderly silicide exhibiting relatively high electrical resistance tends to be produced. This is disadvantageous insofar as polycrystalline silicide generally possesses a sheet resistance that is two to three times greater than that of highly ordered, single crystal silicide.

Sigmon, *Materials Research Society Bulletin*, 1981, p. 511, summarizes efforts by researchers to form silicides by methods other than rapid thermal processing annealing. One proposed alternative is the use of ruby or Nd:YAG pulsed lasers to produce an interdiffusion between the silicon substrate and the deposited metal film followed by reaction to form the silicide. However, the melted silicon produced by long wavelength lasers ($\lambda \geq 0.7$ $\mu$m) such as ruby or Nd:YAG typically has quenching characteristics that result in the formation of a variety of silicide phases, some of which have unfavorable electrical properties. This is because the relatively long wavelengths of radiation produced by Nd:YAG and ruby lasers permits them to penetrate deeply into the silicon, producing a temperature gradient that is highest at the surface and declines gradually at greater depths. Because the formation of silicide phases is temperature dependent, the resulting temperature gradient yields a variety of silicide phases.

Therefore, it is desirable to utilize a process of laser annealing that promotes formation of a single, thermally-stable silicide phase possessing low sheet resistance.

Sigmon also discusses application of radiation from a continuous wave (CW) Argon-Ion laser. Use of a CW Argon-ion laser to cause the reaction to occur in the solid or liquid state, resulting in production of only one single silicide phase. Unfortunately, the total output power of a typical commercial CW Argon-ion laser is less than 50 W, with output power at UV frequencies of less than 5 W. Thus in using a CW Argon-ion laser, the cross-sectional area of the applied beam must be extremely narrow in order to achieve energy densities sufficient to anneal the silicide. Because of the difficulty in achieving full coverage over even small silicon areas with a beam possessing such a small cross-section, CW Argon-ion lasers cannot feasibly be utilized in CMOS applications due to the low throughput and difficulties with process control.

Therefore, it is desirable to form stable silicides by a process of laser annealing that utilizes a laser having sufficient energy density and cross-sectional beam area to promote the formation of stable silicides in a process having high throughput and substantial process efficiency.

SUMMARY OF THE INVENTION

The process in accordance with the present invention is a method for forming silicides that utilizes excimer laser crystallization of amorphous silicon. Specifically, amorphous silicon deposited on top of a layer of unstable silicide is exposed to ultraviolet radiation in the form of a beam generated by an excimer laser. The ultraviolet radiation produced by the excimer laser melts the amorphous silicon, causing it to diffuse into and react with the metal of the underlying unstable silicide. Silicide then crystallizes in a thermally stable form that evidences low electrical resistance.

A better understanding of the features and advantages of the present invention will be obtained by reference to the following detailed description and accompanying drawings, which set forth illustrative embodiments in which the principles of the invention are utilized.

DETAILED DESCRIPTION

The process for forming silicides in accordance with the present invention utilizes the technique of excimer laser crystallization to form stable silicides. Specifically, application of a beam from an excimer laser to a film of amorphous silicon causes extremely localized melting of the amorphous silicon. The melted silicon reacts with metal already present in an underlying layer of unstable silicide. Subsequent cooling and crystallization forms extremely shallow, well-defined, and thermally stable silicide layers of near-epitaxial quality.

Figure 1A:
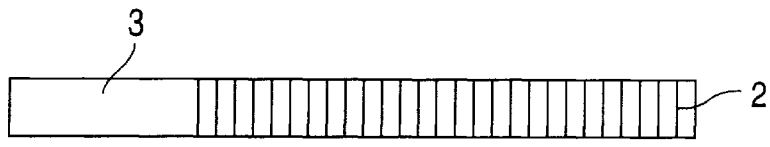
FIGS. 1A–1E show the conventional process of formation of a layer of thermally stable silicide upon silicon.
Figure 2A:
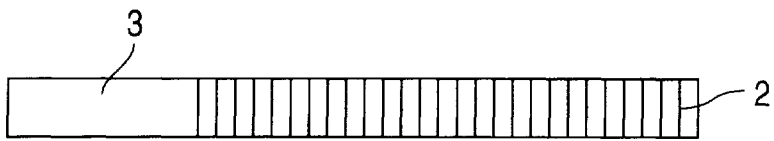
FIGS. 2A–2I show the process of formation of a layer of thermally stable silicide upon silicon in accordance with the present invention.

FIG. 2A, identical to FIG. 1A, shows silicon 2 adjacent to non-silicon 3. Silicon 2 is preferably of single crystal or epitaxial form, but may be polycrystalline. Non-silicon 3 may be oxide, metal, or some other non-silicon feature typically present in modern semiconductor devices.

Figure 1B:
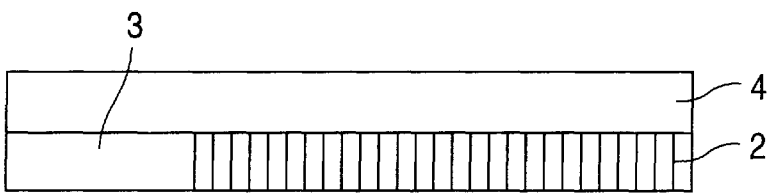
Figure 2B:
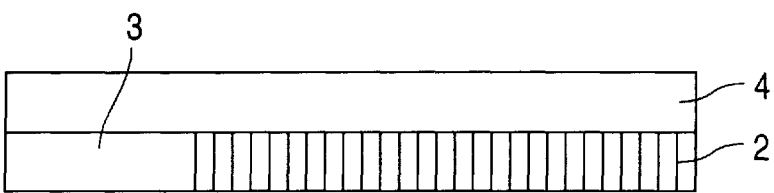

FIG. 2B, identical to FIG. 1B, shows the formation of a metal layer 4 on top of silicon 2 and non-silicon 3. Metal layer 4 may be composed of a variety of refractory metals, with cobalt or titanium being preferred.

Figure 1C:
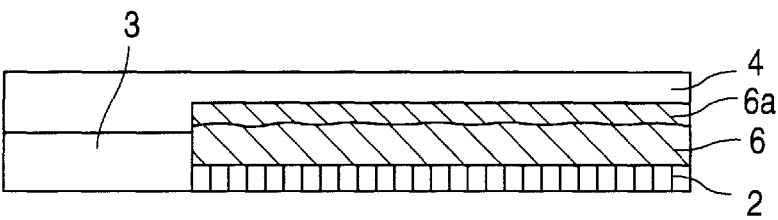
Figure 2C:
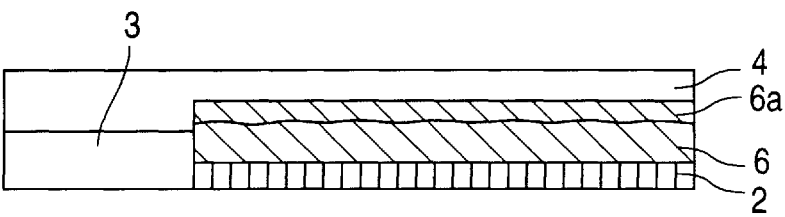

FIG. 2C, identical to FIG. 1C, shows the first, low temperature annealing step to form unstable silicide 6 having metal-rich surface region 6a, on top of silicon 2. This first annealing step generally 500° C. for cobalt and about 650° C. for titanium.

Figure 1D:
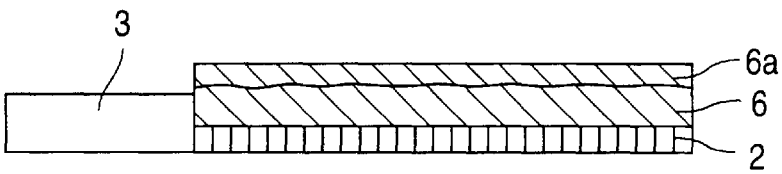
Figure 1E:
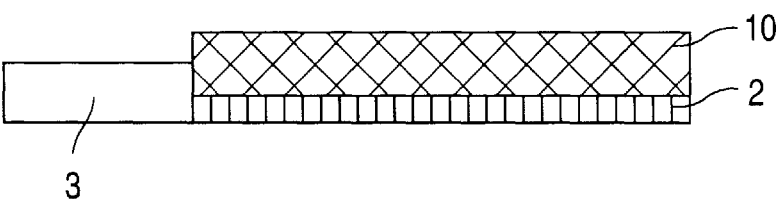
Figure 2D:
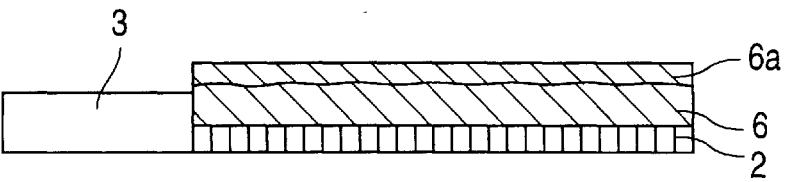

Non-silicon 3 does not react with metal 4 to form unstable silicide 6. Moreover, not all of metal 4 is consumed at the conclusion of the first annealing step. Therefore, FIG. 2D, identical to FIG. 1D, shows the removal of unreacted metal layer 4 by conventional wet or plasma etching techniques.

Figure 2E:
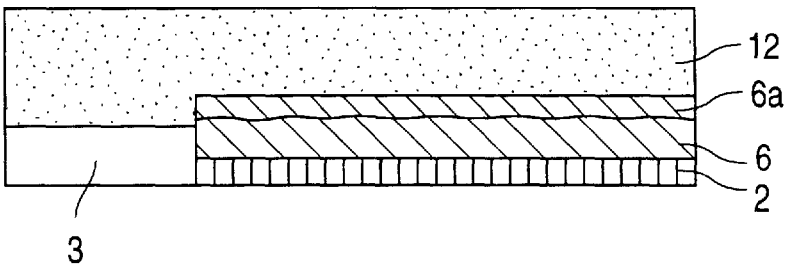

FIG. 2E shows deposition a film of amorphous silicon 12 in accordance with the present invention. Amorphous silicon film 12 is 200–500 Å thick, and is deposited at 300–400 C.° by LPCVD or PECVD using silane gas.

Figure 2F:
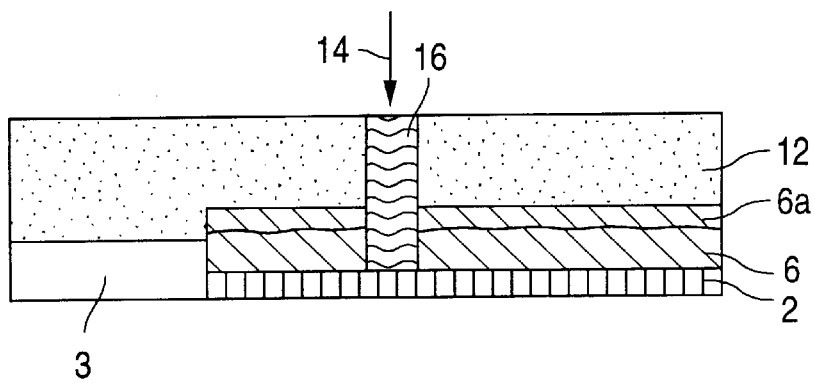
Figure 2G:
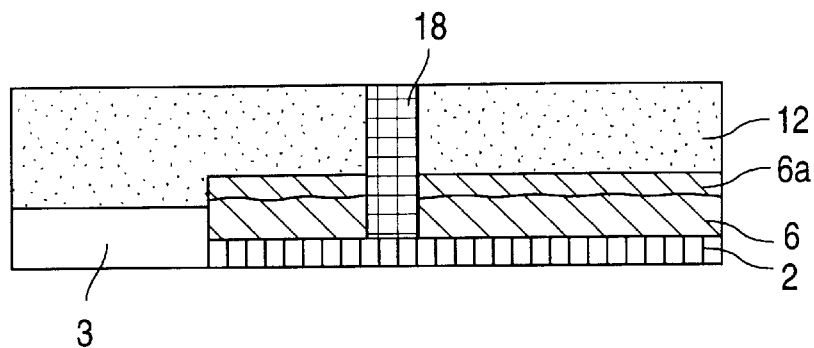

FIGS. 2F–2G show the excimer laser annealing step in accordance with the present invention. FIG. 2F shows the application of an excimer laser beam 14 to amorphous silicon film 12. The application of excimer laser beam introduces a sufficient concentration of energy into extremely localized region 16 of amorphous film 12 to increase the temperature in this region to approximately 1400° C. This temperature is sufficient to melt the amorphous silicon and cause interdiffusion of melted silicon into the metal of the underlying metal-rich layer 6a followed by reaction between the melted silicon and the metal to form thermally stable silicide 18.

The short wavelength of the excimer laser ($\lambda \leq 0.3$ $\mu$m) permits highly selective melting of amorphous silicon in region 16, without inflicting thermal damage upon the underlying silicon 2. The extreme selectivity offered by the excimer laser allows an extremely sharp interface to be created between melted and unmelted regions of silicon.

FIG. 2G shows the crystallization of the thermally stable silicide 18 immediately following cessation of application of the excimer laser beam to region 16. Because the lattice constant of cobalt silicide is virtually identical to that of silicon, stable $CoSi_2$ silicide 18 crystallizes as near-single crystal, epitaxial silicide. For titanium silicide, the thermally stable silicide crystallizes as large grains of $TiSi_2$ in polycrystalline form having lower electrical resistance due to the larger grain sizes.

Figure 2H:
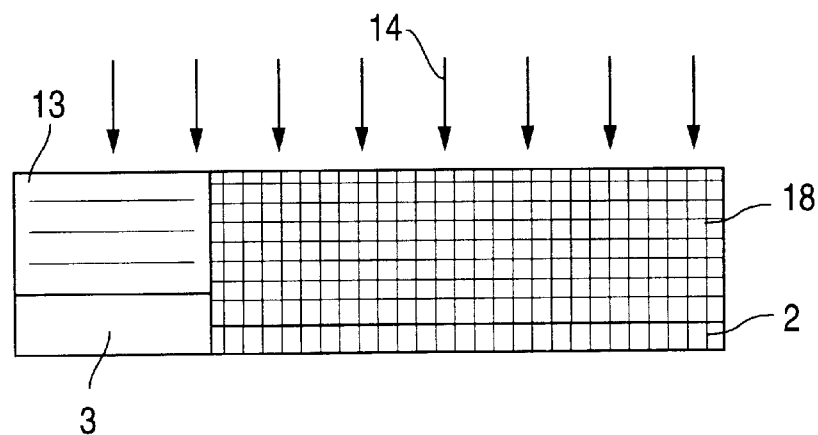

FIG. 2H shows subsequent application of excimer laser beam 14 to additional local regions of amorphous silicon film 12, resulting in reaction and crystallization of thermally stable silicide 18 as described above in reference to FIGS. 2F–2G.

FIG. 2H also shows the nonselective application of excimer laser beam 14 to amorphous silicon 12 on top of non-silicon 3. As no underlying silicon 2 is present to serve as a template for the formation of a thermally stable silicide lattice, amorphous silicon 12 in these regions is transformed into highly disordered polycrystalline silicon 13.

Figure 2I:
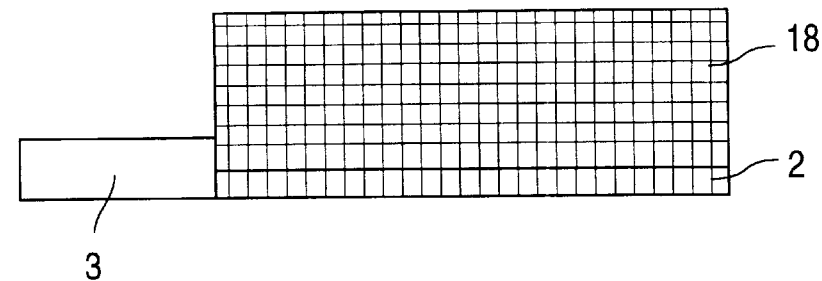

FIG. 2I shows the subsequent stripping of highly disordered polycrystalline silicon 13. This step is facilitated by the greater etch-resistance of thermally stable silicide 18 compared to highly disordered polycrystalline silicon 13. For $CoSi_2$, the extremely high etch-resistance of near-epitaxial cobalt silicide renders permits the use of highly selective plasma etching techniques. The lower etch-resistance of large-grain polycrystalline $TiSi_2$ requires the use of less selective wet etching techniques.

Formation of silicides utilizing the present invention offers a number of important advantages over the prior art. One advantage is that amorphous silicon strongly absorbs the ultraviolet radiation ($\lambda$=198 nm for Cl:Ar; $\lambda$=248 nm for F:Ar; $\lambda$=308 nm for Br:Ar) typically generated by an excimer laser. Because ultraviolet radiation is so readily absorbed by the silicon, energy from the excimer laser may be transmitted to the amorphous silicon in the form of a pulse of extremely short duration ($\approx$50 ns). Such extremely short pulses of energy produce highly localized and selective melting and reaction, and forming extremely shallow silicide layers with sharp border definition that are necessary to allow devices in the submicron range to function.

A second advantage offered by the present invention is that thermally stable silicide having low resistance is produced. The extremely localized melting and crystallization available using the excimer laser allows for formation of a silicide lattice having the high degree of order necessary to provide low resistance.

Laser annealing in accordance with the process of the present invention produces $CoSi_2$ of single crystal, near-epitaxial quality because the lattice constant of $CoSi_2$ is virtually identical to that of silicon. For titanium silicide, thermally stable silicide crystallizes as large grains of $TiSi_2$ in polycrystalline form, with the low resistance properties attributable to the larger grain sizes.

By contrast, silicide produced by the conventional two-step process is typically highly polycrystalline in structure, having sheet resistance two to three times greater than that of the single crystal or large grain polysilicon forms.

A third advantage offered by the present invention is that refractory metal from the underlying unstable silicide regions react with the melted silicon and form the thermally stable silicide lattice. As a result, stable silicides are formed in the substrate drain and source regions practically without consumption of underlying silicon. Depletion of silicon from the substrate during the formation of silicides is a major problem for the deep submicron technology, as removal of silicon from already ultra-shallow drain and source structures can degrade their electrical properties.

A fourth advantage offered by the present invention is that thermally stable silicide phases are more efficiently produced than in conventional process. Silicide phases grow outward from nucleation sites to form grains of varying sizes. Growth of large grains of thermally-unstable silicides can interfere with the nucleation and growth of stable silicide phases.

In the present invention, the grain size of silicide phases produced by excimer layer crystallization can be precisely controlled by varying 1) the thickness of the amorphous silicon film; 2) the density of the ultraviolet radiation produced by the laser; and 3) the temperature of the underlying substrate. Moreover, the extremely small beam cross-section and high radiation energy density produced by excimer lasers promotes formation of silicides of desired grain sizes, thereby preventing interference between competing silicide phases. For example, exposure of a silicon substrate having a temperature of 400° C. to an energy density of 300 $mJ/cm^2$, the average titanium silicide grain size produced is ≈1 μm. A longer pulse duration yields a wider process window at the expense of producing silicides having a variety of different grain sizes.

A fifth advantage posed by the process for forming silicides in accordance with the present invention is elimination of the second, high temperature annealing step formerly required to generate the thermally stable silicide layer from unstable silicides. Substitution of the second, high temperature anneal with extremely localized laser annealing enables stable silicides to be formed with a minimum of thermal diffusion of dopant or unwanted growth of existing oxides.

Figure 3A:
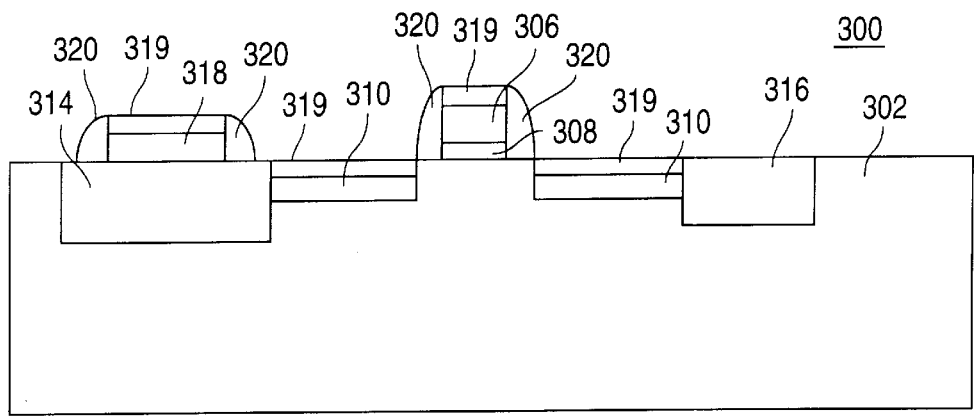
FIGS. 3A–3C show the process of formation of a layer of thermally silicide on the source, gate, drain, and polysilicon contacts of a conventional P-Channel MOS transistor, in accordance with one embodiment of the present invention.
Figure 3B:
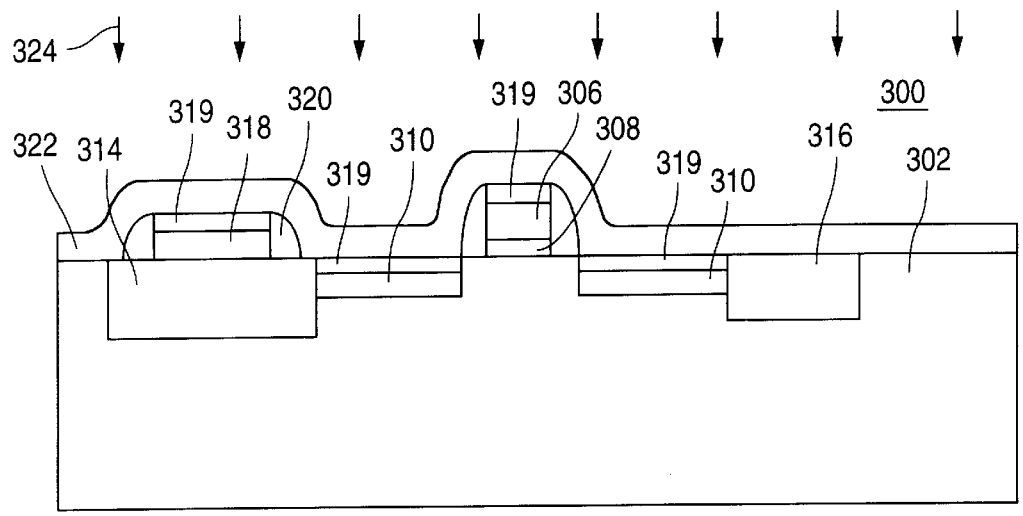
Figure 3C:
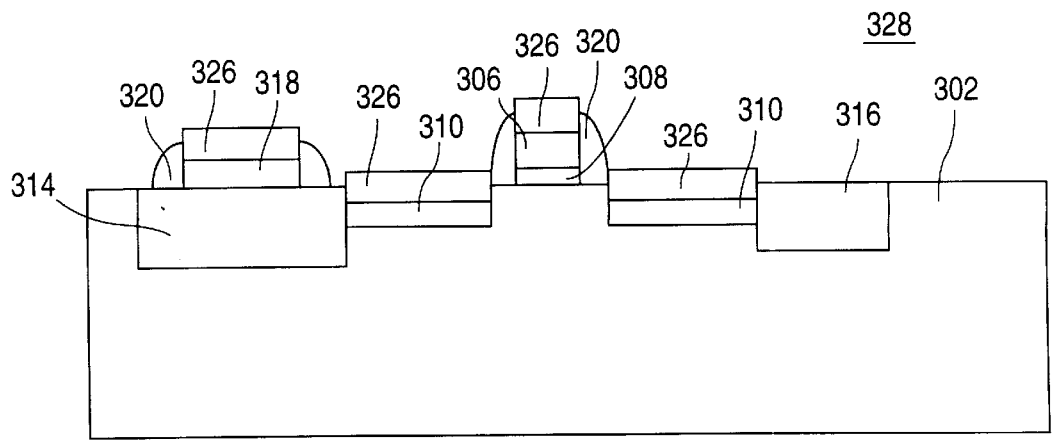

FIGS. 3A–3C illustrate the process in accordance with the present invention as used to form silicided source, gate, drain, and polysilicon contacts of a conventional P-Channel MOS transistor.

FIG. 3A is a cross-sectional view of the precursor P-channel MOS transistor that forms the starting point for the process. Precursor P-channel device 300 comprises lightly P doped silicon substrate 302. Gate 306, formed from polysilicon, is separated from substrate 302 by gate oxide 308. Source/drain regions 310 composed of N doped silicon are located on either side of gate 306. Electrically active gate 306 and drain and source regions 310 are isolated from external electrical fields by field oxides 314 and trench oxide 316. Field oxide 314 also has a polysilicon contact 318. P-channel MOS structure 300 also includes sidewall spacer oxides 320 grown to protect the edges of gate 306 and polysilicon contact 318.

Gate 306, polysilicon contact 318, and source/drain regions 310 of precursor P-channel device 300 each bear a layer of unstable silicide 319 having a metal-rich surface layer. Unstable silicide layer 319 is formed by the conventional deposit of refractory metal followed by a low temperature annealing step.

FIG. 3B shows deposition of the amorphous silicon film 322 over the entire surface of precursor P-channel device 300, followed by the nonselective application of ultraviolet radiation 324 from an excimer laser to amorphous silicon film 322. Nonselective application of the excimer laser over the entire surface of P-channel device 300 is possible because amorphous silicon film 322 reacts to form stable silicide 326 only where underlying silicon is present to serve as a template.

FIG. 3C shows the subsequent stripping of the unreacted polycrystalline silicon film 322 from the surface of P-channel device 300, yielding completed P-channel MOS device 32 having source and drain regions 310, gate 306, and polysilicon contact 318, each bearing thermally stable silicide layer 326.

The P-Channel MOS transistor 300 depicted in FIG. 3A represents merely one of many silicon-based structures upon which silicides may be formed in accordance with the present invention. The emitter, base, and collector regions of bipolar transistors, as well as interconnect lines forming linkages between semiconductor devices, may also be suited for formation of thermally stable silicides utilizing the present invention.

Moreover, the specific process steps described in the above description and figures represent merely one of many embodiments in accordance with the present invention. Depending upon the particular application, different beam energies, pulse durations, and substrate temperatures can be utilized to optimize the throughput and efficiency of silicide formation process in accordance with the present invention. In addition, a variety of combinations of energy density, radiation wavelength, and pulse duration, will be required depending upon the thickness of the amorphous silicon film.

Therefore, it is intended that the following claims define the scope of the invention, and that methods and structures within the scope of these claims and their equivalents be covered thereby.

What is claimed is:

1. A method of forming thermally stable silicide comprising the steps of:

forming over a silicon surface a layer of thermally unstable silicide having a surface layer containing a refractory metal;

forming a film of amorphous silicon over the thermally unstable silicide;

applying a pulse of ultraviolet radiation to the amorphous silicon such that amorphous silicon overlying the unstable silicide reacts with the refractory metal to form a layer of thermally stable silicide while amorphous silicon not overlying unstable silicide melts to form polysilicon; and removing the polysilicon.

2. The method in according to claim 1 wherein the applied pulse of ultraviolet radiation is generated by an excimer laser.

3. The method according to claim 2 wherein the step of forming the thermally unstable silicide includes depositing a layer of refractory metal upon the silicon surface followed by annealing the silicon at a temperature of between approximately 500° C. and 650° C.

4. The method according to claim 3 wherein the amorphous silicon film formed is between approximately 200 and 400 Å in thickness.

5. The method according to claim 4 wherein the step of removing polysilicon is performed by one of a wet etching and a plasma etching process.

6. The method according to claim 5 wherein the unstable silicide layer contains cobalt and the thermally stable silicide formed is of near-epitaxial quality.

7. The method according to claim 4 wherein the unstable silicide layer formed contains titanium and the thermally stable silicide formed is polycrystalline with a grain size of about 1 $\mu$m.

8. The method according to claim 2 wherein the refractory metal is selected from the group consisting of titanium, cobalt, nickel, palladium, platinum, molybdenum, or tungsten.

* * * * *